United States Patent
Jain et al.

(10) Patent No.: US 7,496,589 B1
(45) Date of Patent: Feb. 24, 2009

(54) HIGHLY COMPRESSED RANDOMLY ACCESSED STORAGE OF LARGE TABLES WITH ARBITRARY COLUMNS

(75) Inventors: Arvind Jain, Sunnyvale, CA (US); Gurmeet Singh Manku, Mountain View, CA (US)

(73) Assignee: Google Inc., Mountain View, CA (US)

( * ) Notice: Subject to any disclaimer, the term of this patent is extended or adjusted under 35 U.S.C. 154(b) by 281 days.

(21) Appl. No.: 11/178,655

(22) Filed: Jul. 9, 2005

(51) Int. Cl.
- *G06F 7/00* (2006.01)
- *G06F 17/30* (2006.01)
- *G06F 15/16* (2006.01)
- *G06F 13/12* (2006.01)
- *G06F 13/38* (2006.01)

(52) U.S. Cl. .................. 707/101; 707/102; 708/203; 709/247; 710/68

(58) Field of Classification Search ......... 707/101–104; 708/203; 709/247; 710/68
See application file for complete search history.

(56) References Cited

U.S. PATENT DOCUMENTS

| | | | | |
|---|---|---|---|---|
| 5,414,834 A | * | 5/1995 | Alexander et al. | 707/100 |
| 5,794,228 A | * | 8/1998 | French et al. | 707/2 |
| 5,918,225 A | * | 6/1999 | White et al. | 707/3 |
| 6,006,232 A | * | 12/1999 | Lyons | 707/101 |
| 6,169,990 B1 | * | 1/2001 | McGregor et al. | 707/101 |
| 6,298,342 B1 | * | 10/2001 | Graefe et al. | 707/4 |
| 6,725,225 B1 | * | 4/2004 | Kori | 707/101 |
| 6,778,996 B2 | * | 8/2004 | Roccaforte | 707/104.1 |
| 6,879,984 B2 | * | 4/2005 | Duddleson et al. | 707/101 |
| 7,024,414 B2 | * | 4/2006 | Sah et al. | 707/101 |
| 7,103,588 B2 | * | 9/2006 | Beck et al. | 707/2 |
| 7,103,608 B1 | * | 9/2006 | Ozbutun et al. | 707/102 |
| 7,181,457 B2 | * | 2/2007 | Reinauer et al. | 707/10 |
| 2002/0178171 A1 | * | 11/2002 | Walker et al. | 707/102 |
| 2004/0148301 A1 | * | 7/2004 | McKay et al. | 707/101 |
| 2005/0219076 A1 | * | 10/2005 | Harris | 341/51 |
| 2006/0123035 A1 | * | 6/2006 | Ivie | 707/101 |

* cited by examiner

*Primary Examiner*—Christian P. Chace
*Assistant Examiner*—Vei-Chung Liang
(74) *Attorney, Agent, or Firm*—Sterne, Kessler, Goldstein & Fox PLLC

(57) ABSTRACT

A table, such as a database table can be partitioned into blocks that are conveniently sized for storage and retrieval. The amount of storage space required and the speed of storing and retrieving blocks is proportional to the size of the blocks. Compressing the blocks leads to less required space and more speed. The columns in a table, and therefore the rows in a transposed block, tend to contain similar data. Compression algorithms can work more efficiently when sequential data items are similar. Therefore, transposing the blocks before compression or compressing them in a column-wise manner leads to better compression. Different compression algorithms can be used for each set of columnar data to yield even better compression.

23 Claims, 5 Drawing Sheets

HIGHLY COMPRESSED RANDOMLY ACCESSED STORAGE OF LARGE TABLES WITH ARBITRARY COLUMNS

TECHNICAL FIELD

Embodiments relate to the field of data storage, data compression, and computer databases. Embodiments also relate to partitioning a database into blocks, optionally transposing the blocks, and compressing the blocks before storage.

BACKGROUND

One of the primary applications of computers is operating databases. Computer databases are collections of data that are stored in a computer memory and can be accessed through the computer. Many databases, such as the phone number list in a cell phone, are fairly small. Some databases, such as the stored tax records of every taxpayer in the United States, are exceptionally large. Exceptionally large databases are expensive to store and maintain. Accessing data in an exceptionally large database can be slow, expensive, or both because the desired data must be found and accessed in the midst of a great magnitude of other data.

Most databases are centered around the concept of tables. Tables are made up of rows and the rows are made of columns of data. For example, the taxpayer database could have a row for every individual taxpayer. The columns in each row hold specific data. The first column can be the taxpayer's identification number, the second column can be the taxpayer's surname, the third can be the taxpayers forename.

An index can be used to help find rows in a table. The index associates index keys with table rows. The taxpayer's identification number is a good index key for the taxpayer database because it is unique. It is unique because no two taxpayers are supposed to have the same taxpayer identification number. A combination of the surname and the forename can also be used as an index key. Such an index key, however, can match multiple rows in the table. Multiple indexes can be used to map different index keys to table rows. The index, or indices if more than one index is maintained, is usually updated when the table is changed.

A typical chain of events that occur when accessing a database starts with obtaining an index key. An index is used to obtain a list of row identifiers matching the index key. If there are no matching row identifiers, then the list is empty. Each row identifier obtained from the index can be any value or set of values that can be used to access a row in the table. Examples are a row index, which is the row number, or a row pointer, which is the row's location in the computer memory. The row data is then accessed by transferring it from wherever it is stored to the where it can be used.

The rows of very large tables are often stored in large arrays of storage devices such as computer disk drives, computer tape libraries, read only memory (ROM) disk libraries, or a combination of different storage devices. Compact Discs (CDs) and Digital Video Discs (DVDs) are examples of ROM disks. The disks and tapes are also known as physical volumes. To access a row, the physical volume, or volumes, holding the row must be accessed.

Database owners trade access speed for expense. A row in a table can be accessed quickly if the physical volume can be accessed quickly. Some technologies, such as a computer's solid-state memory, can be accessed extremely quickly but is far more expensive than other types of memory. Other technologies, such as a computer's hard disk drive, are less expensive than solid-state memory and are slower. Computer tape is very inexpensive and very slow.

Some exceptionally large tables are stored in computer tape libraries. An index key is used to find a row and a physical volume. The physical volume, a computer tape, is located and loaded into a computer tape drive. The computer tape then streams through the computer tape drive until the desired row is reached. The row data is then copied to a faster memory type such as a computer disk drive or solid-state memory. As can be imagined, this exceptionally large table is exceptionally slow to access.

Data compression is a technology for fitting data into a smaller amount of physical memory. The key to data compression is that there is a difference between information and data. A series of a billion zeros is a lot of data, but has little information. Based on formatting, a single page can carry 5,000 legible characters. A series of a billion zeros can consume 200,000 pages. The phrase "a series of a billion zeros" takes 6 words for a total of 22 characters. As such, 200,000 pages of data can be compressed into 22 characters of information.

Those skilled in the art of data compression know many data compression algorithms including zip, LZW, RLE, differential coding, GIF, JPEG, and many others. Every algorithm has different properties and different algorithms work better on different types of data.

Table rows can be compressed to consume less physical memory. Compressing all the rows in a table can result in fewer physical volumes storing the table. It can also result in a faster more expensive memory type becoming feasible for storing the table. Another advantage of compressed data is that it can be transferred faster.

Any improvement in table data compression over current technology enables faster access without increasing costs or enables similar performance at a lower price.

Based on the foregoing it can be appreciated that in order to overcome the shortcomings of the current methods and systems a need exists for an improved method and system for compressing the data in a database table.

BRIEF SUMMARY

The following summary is provided to facilitate an understanding of some of the innovative features unique to the embodiments and is not intended to be a full description. A full appreciation of the various aspects of the embodiments can be gained by taking the entire specification, claims, drawings, and abstract as a whole.

It is therefore one aspect of the embodiments to overcome the shortcomings in current technology by obtaining a table made of rows. The rows are made of columns and each row is associated with an index key. As discussed above, an index associates index keys to rows.

Another aspect of the embodiments is to choose a block size, which is a number of rows, and to partition the table into blocks. Partitioning assigns every row in the table to a block. Most blocks contain the block size number of rows, some can contain less, but none can contain more.

Yet another aspect of the embodiments is to create a block index that indicates which block each row is assigned to and to compress some or all of the blocks before storing them on a storage device such as a computer disk drive.

A block can be compressed in a number of ways. One solution is to simply compress the entire block of data at once. As such, only one compression algorithm is used on all the data in the block. The block can be compressed column-wise or transposed and then compressed row-wise. Row-wise means the compression proceeds row by row. Column-wise means that the compression proceeds column by column. In row-wise compression, different compression algorithms can be used to compress each row. Similarly, in column-wise compression, different compression algorithms can be used to compress each column. An algorithm identifier can be associated with a compressed block, compressed row, or compressed column such that it the correct decompression algorithm can be used later.

A further aspect of the embodiments is to obtain an index key and use the index key to obtain a row identifier from an index. The row identifier is used to obtain a block identifier from a block index. A compressed block, as specified by the block identifier, is then obtained from a storage device and then decompressed to produce a block. The row identified by the row identifier is then obtained from the block.

As discussed above, blocks can be transposed before compression and they can be compressed in a row-wise or column-wise manner. As such, a block can be transposed after decompression and before the row is obtained. Blocks can be decompressed in a row-wise or column-wise manner. The decompression algorithm used to decompress compressed data can be specified by an algorithm identifier associated with that compressed data.

BRIEF DESCRIPTION OF THE DRAWINGS

The accompanying figures, in which like reference numerals refer to identical or functionally similar elements throughout the separate views and which are incorporated in and form a part of the specification, further illustrate the present invention and, together with the background of the invention, brief summary of the invention, and detailed description of the invention, serve to explain the principles of the present invention.

DETAILED DESCRIPTION

The particular values and configurations discussed in these non-limiting examples can be varied and are cited merely to illustrate embodiments and are not intended to limit the scope of the invention.

Overview

A table, such as a database table can be partitioned into blocks that are conveniently sized for storage and retrieval. The amount of storage space required and the speed of storing and retrieving blocks is related to the size of the blocks. Compressing the blocks leads to less required space and more speed. The columns in a table, and therefore the rows in a transposed block, tend to contain similar data. Compression algorithms can work more efficiently when sequential data items are similar. Therefore, transposing the blocks before compression or compressing them in a column-wise manner leads to better compression. Different compression algorithms can be used for each set of columnar data to yield even better compression.

High Level Process Flow

Figure 1:
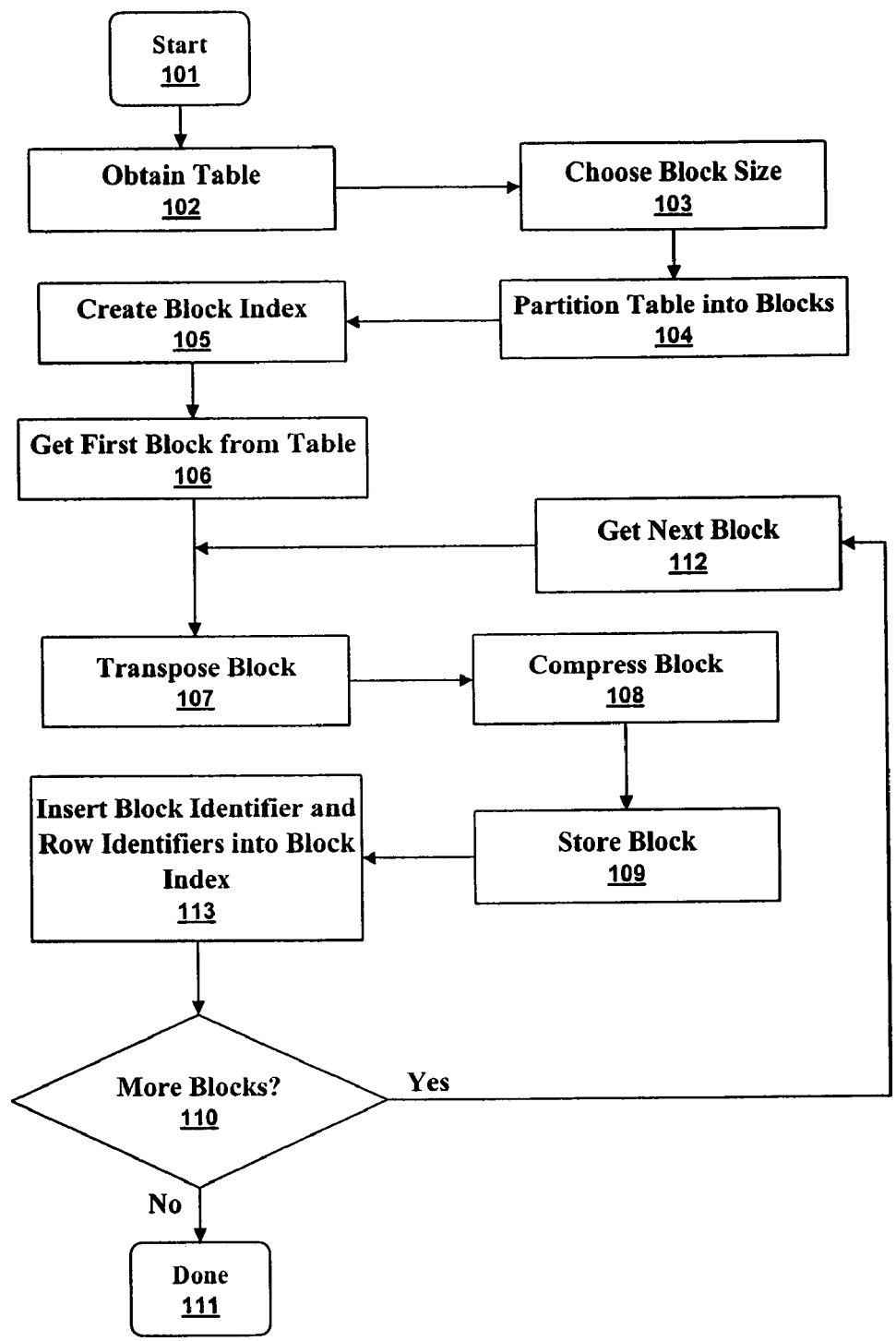
FIG. 1 illustrates a high level flow diagram illustrating partitioning and compressing a table in accordance with an embodiment.

FIG. 1 illustrates a high level flow diagram illustrating partitioning and compressing a table in accordance with an embodiment. After the start 101, a table is obtained 102. As discussed above, the table can be in physical volumes such as computer disk drives, ROM disks, or computer tapes. A block size, which is the number of rows per block, is chosen 103 as an arbitrary number, as an educated guess for maximizing price or performance, as the result of detailed cost benefit analysis, or in some other manner. The table is then partitioned into blocks 104 where the number of rows in each block is equal to or less than the block size. Based on how the table is partitioned, a block index that associates row identifiers to block identifiers is created 105, although not yet populated. A block identifier is a value or set of values that can be used to access a block. A block number or a block pointer can be used as a block identifier. A block pointer indicates the location of a block in memory. The first block is obtained 106, transposed 107, compressed 108, and stored 109. After the block is stored, its block identifier is known. The rows that are in the block are also known. The block identifier and row identifiers are inserted in the block index 113. If there are more blocks 110, then the next block is obtained 112 and the process loops back to transposing the block 107. Otherwise, the process is done 111.

The high level flow of FIG. 1 transposes each block before compression. The transposition step and the subsequent row-wise operation is discussed in detail below. An alternative embodiment does not transpose the block but obtains a similar result by operating on the block in a column-wise manner. Column-wise operation is also discussed below.

Figure 2:
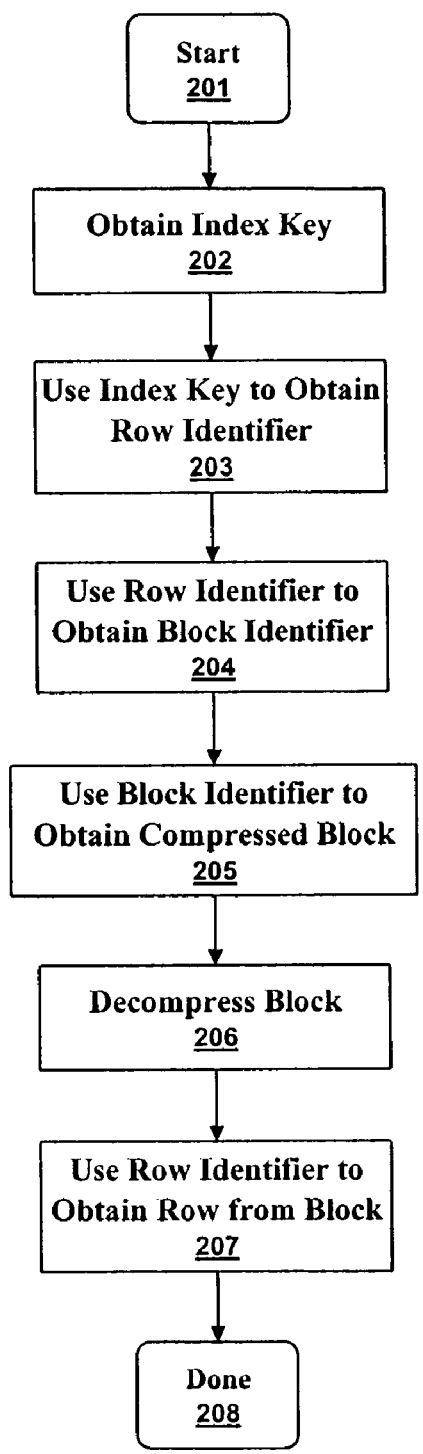
FIG. 2 illustrates a high level flow diagram of obtaining a row from a table that has been partitioned and compressed in accordance with an embodiment.

FIG. 2 illustrates a high level flow diagram of obtaining a row from a table that has been partitioned and compressed in accordance with an embodiment. After the start 201, an index key is obtained 202 and a row identifier is obtained by using the key 203. As discussed above, an index can associate an index key with one or more row identifiers. If the index key is associated with more than one row, then each row can be obtained in turn via a process flow similar to that of FIG. 2. One skilled in the art of computer databases or computer programming is familiar with handling multiple rows returned by a single index key.

After obtaining the row identifier 203, the row identifier is used to obtain a block identifier 204. The block index, which associates row identifiers and block identifiers, can be used to obtain the block identifier. The block identifier is used for obtaining the compressed block. One skilled in the art of computer databases or computer programming can, on contemplation of the embodiments disclosed herein, adapt current methods and systems for obtaining a row when given a row identifier to the task of obtaining a block when given a block identifier because both cases involve using an identifier to access data.

Once the compressed block is obtained 205, it is decompressed 206 into a block that contains rows. The row identifier can be used to obtain the desired row from the block 207 before the process is done 208.

Architectural Overview

Figure 3:
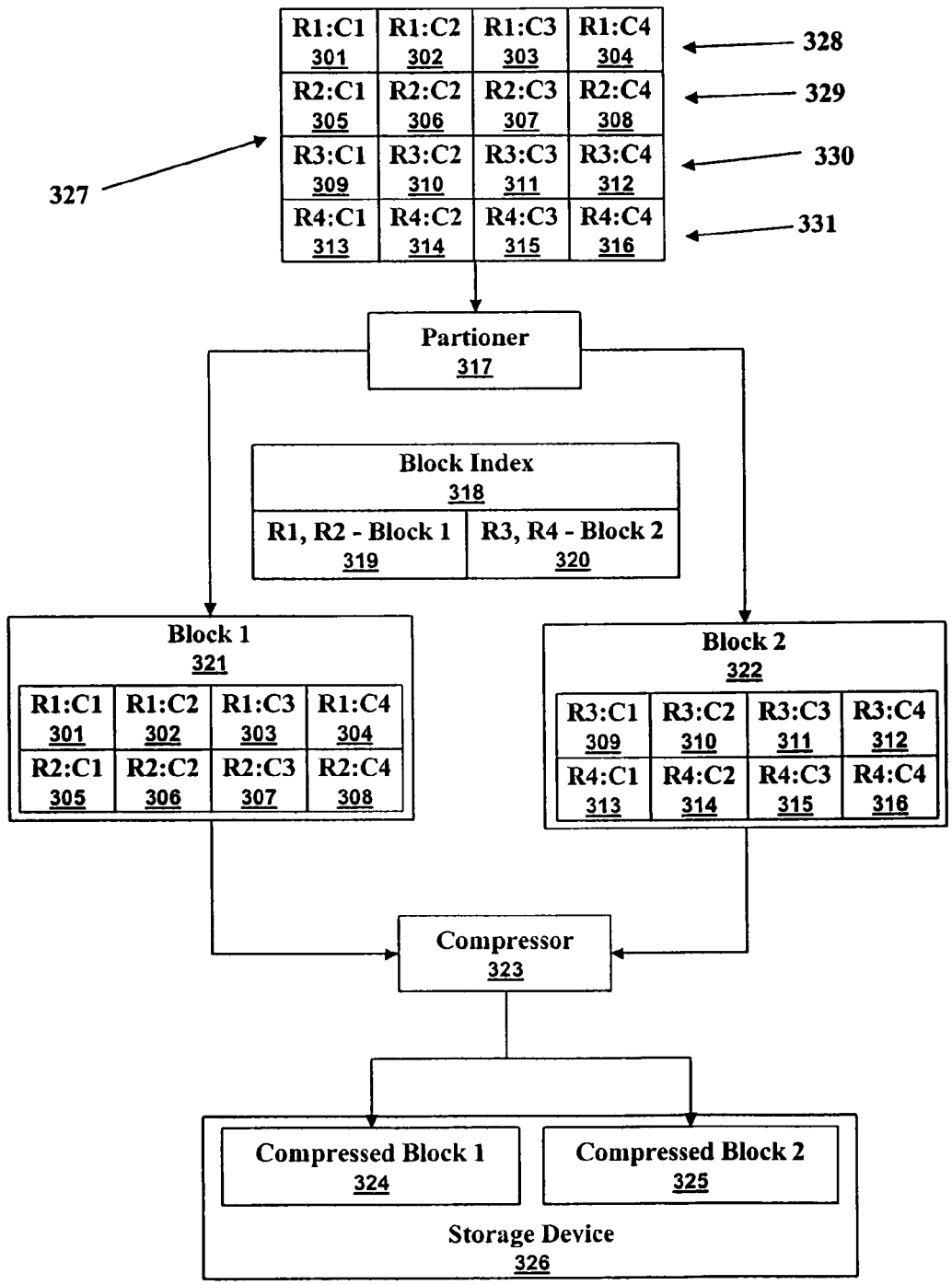
FIG. 3 illustrates partitioning and compressing a table in accordance with an embodiment.

FIG. 3 illustrates partitioning and compressing a table in accordance with an embodiment. A table 327 contains four rows 328, 329, 330, 331. In actual practice, a table can contain millions of rows. Four rows, however, is adequate for illustrating aspects of the embodiments. Each row is shown containing four columns. Row 1 328, referred to as R1, contains columns R1:C1 301, R1:C2 302, R1:C3 303, and R1:C4 304. Row 2 329, referred to as R2, contains columns R2:C1 305, R2:C2 306, R2:C3 307, and R2:C4 308. Row 3 330, referred to as R3, contains columns R3:C1 309, R3:C2 310, R3:C3 311, and R3:C4 312. Row 4 331, referred to as R4, contains columns R4:C1 313, R4:C2 314, R4:C3 315, and R4:C4 316.

The table 327 can be submitted to a partitioner 317 that partitions it into blocks. A block size of 2 is selected. The table 327 is partitioned into block 1 321 containing R1 328 and R2 329 and block 2 322 containing R3 330 and R4 331. The block index 318 indicates which rows are in which block in it's first entry 319 and in it's second entry 320.

A compressor compresses block 1 321 into compressed block 1 324 and block 2 322 into compressed block 2 325.

Figure 4:
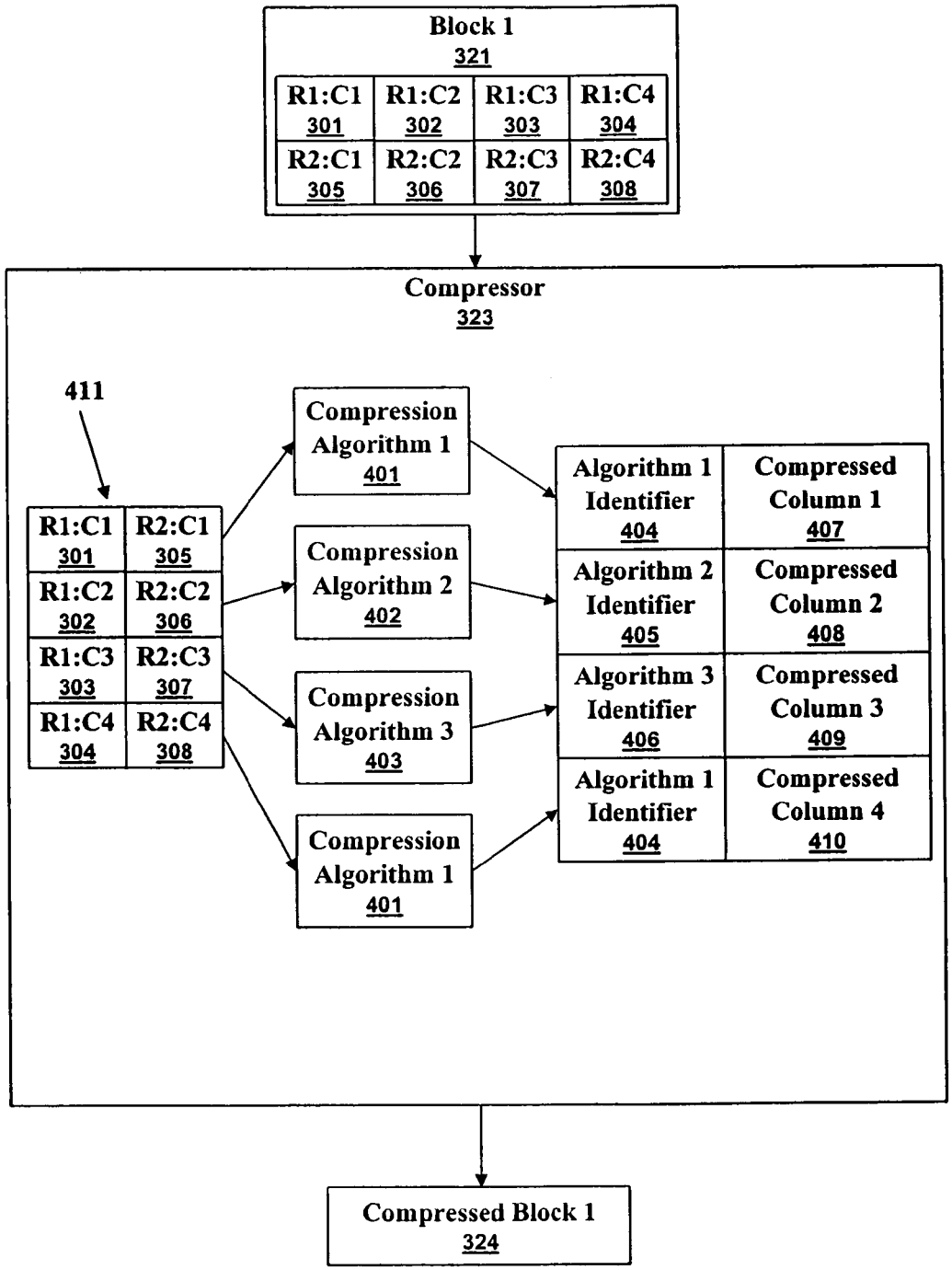
FIG. 4 illustrates compressing a block in accordance with an embodiment.

FIG. 4 illustrates compressing a block in accordance with an embodiment. Block 1 321 is passed to the compressor 323 where it is transposed. Block 1's transposed form 411 is shown. To transpose a table, the rows are turned into columns and the columns into rows. As such 2 row by 4 column block 1 321 becomes 4 rows by 2 columns. The first column of the first row, R1:C1 301 remains the first column of the first row. The first column of the second row, R2:C1 305, however becomes the second column of the first row. The rest of the block 321 is similarly transposed. Transposition is a common operation in matrix algebra, image processing, and database manipulation.

As discussed above, the columns usually hold a specific type of data, such as tax payer identifications in column 1 and surnames in column 2. In such a case, R1:C1 301, R2:C1 305, R3:C1 309, and R4:C1 313 would all hold tax payer identifications. Similarly, R1:C2 302, R2: C2 306, R3: C2 310, and R4: C2 314 would all hold surnames.

The reason for transposing the block is that many computers access a block in a row-wise manner and compression algorithms work best on similar data. Row-wise means that each row is accessed in order. Without transposition, row-wise access proceeds from R1:C1, a number, to R1:C2 302, a name. After transposition, row-wise access proceeds from R1:C1 301, a number to R2:C1 305, another number. Later, access proceeds from R1:C2 302, a surname to R2: C2 306, another surname. Transposing a block that is accessed row-wise results in higher compression. Some computers can access a table or block in a column-wise order. If column-wise access can be used, transposition is not necessary.

The block 1's first column, consisting of R1:C1 301 and R2:C1 305, is passed to compression algorithm 1 401 to become compressed column 1 407. Compression algorithm 1 is used because it compresses the first column's type of data well. Compressed column 1 407 is paired with the algorithm 1 identifier 404 so that the correct algorithm can be used for subsequent decompression. Note that if compression algorithm 1 401 is always used on column 1 then the algorithm identifier is not needed. Algorithm identifiers are used when different algorithms can be used and a record must be kept of which algorithm is actually used on each column. Algorithms can change because a person decides to use a different one, because the computer automatically selects the best algorithm, or some other reason.

One effective algorithm identifier specifies that the column, or row, with which it is associated is split. For example, every cell in the column could contain a string like "TIME=12:34.25". Splitting the column into two sub-columns where the first contains "TIME=" and the second contains a changing timestamp such as "12:34.25" can result in an impressive compression ratio when the sub-columns are compressed separately. The algorithm identifier for splitting also contains a specifier for reassembling the cells. A regular expression is an example of such a specifier. Each sub-column can have its own associated algorithm ID and can be further split. Furthermore, a column can be split into a single sub-column because the specifier can insert parts of a string. In the example above, the specifier can cause the string "TIME=" to be prepended to the cell contents.

As mentioned above, a computer can automatically select the best algorithm for the blocks or the columns, or rows, being compressed. Ideally, the computer could exhaustively test every compression algorithm for every compressible piece of data. In reality, however, a few representative pieces of data can be tested. The computer can randomly select blocks, select the first few blocks in the table, or select blocks in some other way. The computer can then test compression algorithms, either block-wise, column-wise, or row-wise, to choose the best algorithm.

The second column, consisting of R1:C2 302 and R2:C2 306, is passed to compression module 2 402 to become compressed column 2 408 paired with algorithm identifier 2 405. The third column, consisting of R1:C3 303 and R2:C3 307, is passed to compression module 3 403 to become compressed column 3 409 paired with algorithm identifier 3 406. The fourth column, consisting of R1:C4 304 and R2:C4 308, is passed to compression module 1 401 to become compressed column 4 410 paired with algorithm identifier 1 404. The compressed columns and algorithm identifiers become compressed block 1 324.

Figure 5:
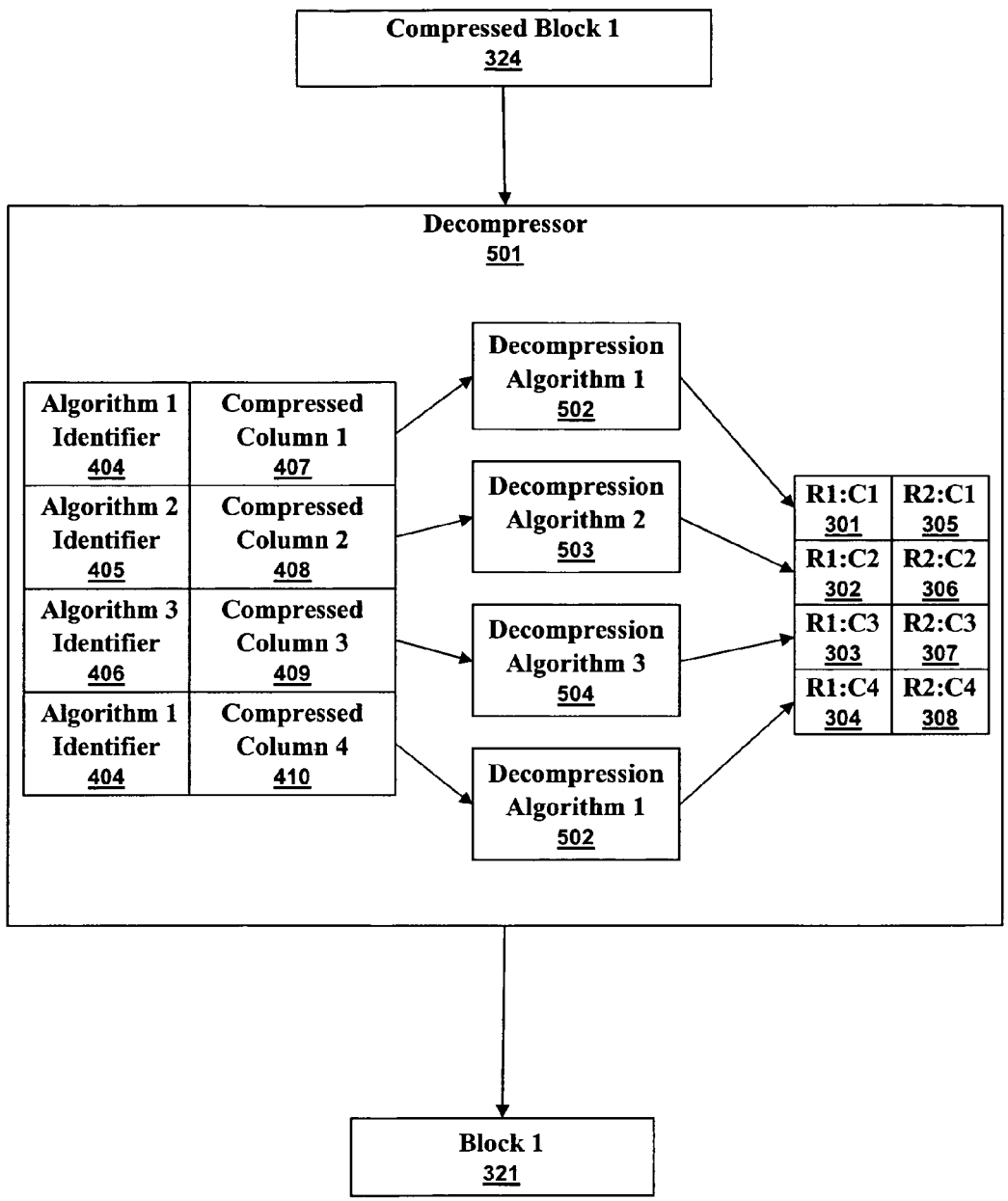
FIG. 5 illustrates decompressing a block in accordance with an embodiment.

FIG. 5 illustrates decompressing a block in accordance with an embodiment. Compressed block 1 324 is passed to a decompressor 501. Compressed column 1 407, paired with the algorithm 1 identifier 404, is passed to decompression algorithm 1 502 and becomes the first column of block 1 321 consisting of R1:C1 301 and R2:C1 305. The other compressed columns are decompressed similarly with decompression algorithms 503 and 504. The decompressor illustrated produces a transposed version of the block. As such, it must be transposed again to reproduce the original block 1 321. As before, if column-wise access is used, transposition is not necessary.

General

Embodiments can be implemented in the context of modules. In the computer programming arts, a module (e.g., a software module) can be implemented as a collection of routines and data structures that perform particular tasks or implement a particular abstract data type. Modules generally can be composed of two parts. First, a software module may list the constants, data types, variables, routines and the like that can be accessed by other modules or routines. Second, a software module can be configured as an implementation, which can be private (i.e., accessible perhaps only to the module), and that contains the source code that actually implements the routines or subroutines upon which the module is based. Thus, for example, the term "module", as utilized herein generally refers to software modules or implementations thereof. Such modules can be utilized separately or together to form a program product that can be implemented through signal-bearing media, including transmission media and recordable media.

The examples discussed above are intended to illustrate aspects of the embodiments. The phrases "an embodiment" or "one embodiment" do not necessarily refer to the same embodiment or any specific embodiment.

It will be appreciated that various of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. A method implemented by a processor executing instructions stored on a tangible computer-readable medium comprising:
obtaining a table comprising at least one row wherein each row comprises at least one column, and wherein each row is associated with an index key value;
choosing a block size and partitioning the table into at least one block wherein each one of the at least one row is assigned to respective one of the at least one block and also wherein each of the at least one block is not larger than the block size;
creating a block index that indicates which of the at least one block is assigned each one of the at least one row; and
compressing the at least one block to produce at least one compressed block and then storing the at least one compressed block on a storage device, wherein each line of data of the at least one block is separately compressed using a respective compression algorithm that is selected as a desired algorithm based upon testing a plurality of different compression algorithms, and wherein the compressing uses at least two different compression algorithms to compress different lines of data for the same block.

2. The method of claim 1 further comprising transposing the at least one block before compression.

3. The method of claim 1 further comprising associating an algorithm identifier with each row of the at least one block.

4. The method of claim 3 wherein the algorithm identifier specifies splitting the associated row into separately compressed sub-rows wherein each sub-row is then separately compressed and associated with an algorithm identifier.

5. The method of claim 4, further comprising automatically selecting the algorithm to compress each sub-row including testing different algorithms on one or more sub-rows and selecting a desired algorithm based on the testing.

6. The method of claim 5, further comprising selecting the desired algorithm based on a best algorithm for compressing data well.

7. The method of claim 1 wherein the compression proceeds in a column-wise order.

8. The method of claim 7 wherein each column of the at least one block is separately compressed using the compression algorithm that is selected.

9. The method of claim 8 further comprising associating an algorithm identifier with each column of the at least one block.

10. The method of claim 9 wherein the algorithm identifier specifies splitting the associated column into separately compressed sub-columns wherein each sub-column is then separately compressed and associated with an algorithm identifier.

11. The method of claim 10, further comprising automatically selecting the algorithm to compress each sub-column including testing different algorithms on one or more sub-columns and selecting a desired algorithm.

12. The method of claim 1, further comprising selecting the desired algorithm based on a best algorithm for compressing data well.

13. A method implemented by a processor executing instructions stored on a tangible computer-readable medium comprising:
obtaining an index key, using the index key with an index to obtain a row identifier and using the row identifier with a block index to obtain a block identifier;
obtaining a compressed block from a storage device wherein the compressed block is specified by the block identifier;
decompressing the compressed block to produce a block; and
using the row identifier to obtain a row from the block, wherein each line of data of the at least one block is separately decompressed using a decompression algorithm, wherein the decompressing uses at least two different decompression algorithms to decompress different lines of data for the compressed block.

14. The method of claim 13 further comprising transposing the block after decompressing it and before obtaining the row.

15. The method of claim 14 wherein each row of the block is separately decompressed using the decompression algorithm specified by an algorithm identifier associated with the row.

16. The method of claim 13 further comprising decompressing the block in a column-wise order.

17. The method of claim 16 wherein each column of the block is separately decompressed using the decompression algorithm specified by an algorithm identifier associated with the column.

18. A system comprising:
a table comprising at least one row wherein each row comprises at least one column;
an index that can map an index key to a row identifier that specifies one of the at least one row;
a partitioner that partitions the table into at least one block that is no larger than a block size and wherein each of the at least one row is assigned to one of the at least one block;
a block index that associates each of the at least one row with one of the at least one block;
at least one compression algorithm and at least one decompression algorithm for compressing and decompressing the at least one block, wherein each line of data of the at least one block is separately compressed using a respective compression algorithm and decompressed using a respective decompression algorithm and wherein at least two different compression algorithms are used to compress different lines of data within the same block; and
a storage device for storing the at least one compressed block.

19. The system of claim 18 further comprising a module that transposes each of the at least one block.

20. The system of claim 19 wherein each of the at least one row in the at least one block can be separately compressed using one of the at least one compression algorithm or decompressed using one of the at least one decompression algorithm.

21. The system of claim 20 further comprising an algorithm identifier that specifies one of the at least one compression algorithm or one of the at least one decompression algorithm for use with each of the at least one row.

22. The system of claim 18 wherein the at least one block is treated column-wise and further comprising an algorithm index that specifies one of the at least one compression algorithm or one of the at least one decompression algorithm for use with each of the at least one column.

23. A system comprising:
- a means of partitioning a table into at least one block;
- a means of mapping an index key to a row and mapping the row to one of the at least one block;
- a means of converting the at least one block to and from at least one compressed block wherein columnar table data is treated sequentially; and
- a means for the storage and retrieval of the at least one compressed block, wherein each line of data may be compressed separately using an algorithm automatically selected by testing different algorithms for compressing the each line of data and wherein at least two different compression algorithms are used to compress different lines of data within the same block.

* * * * *